United States Patent
Sato

(10) Patent No.: US 7,589,344 B2
(45) Date of Patent: Sep. 15, 2009

(54) SEMICONDUCTOR DEVICE AND METHOD OF PRODUCING THE SAME

(75) Inventor: Natsuki Sato, Tokyo (JP)

(73) Assignee: Elpida Memory, Inc., Tokyo (JP)

(*) Notice: Subject to any disclaimer, the term of this patent is extended or adjusted under 35 U.S.C. 154(b) by 125 days.

(21) Appl. No.: 11/490,073

(22) Filed: Jul. 21, 2006

(65) Prior Publication Data

US 2007/0018149 A1    Jan. 25, 2007

(30) Foreign Application Priority Data

Jul. 22, 2005    (JP)    ............................. 2005-212419

(51) Int. Cl.
*H01L 45/00*    (2006.01)
*H01L 31/032*    (2006.01)

(52) U.S. Cl. .................. 257/4; 257/2; 257/3; 257/5; 257/E45.002; 257/E31.029

(58) Field of Classification Search .............. 257/2, 257/3, 4, 5, E45.022, E31.029
See application file for complete search history.

(56) References Cited

U.S. PATENT DOCUMENTS

| 7,339,185 B2 * | 3/2008 | Song et al. ................ 257/3 |
| 2005/0265072 A1 * | 12/2005 | Hart et al. ................ 365/163 |
| 2006/0208847 A1 * | 9/2006 | Lankhorst et al. .............. 338/9 |

FOREIGN PATENT DOCUMENTS

| JP | 4-045585 | 2/1992 |
| JP | 2004-349709 | 12/2004 |
| JP | 2005-32855 | 2/2005 |

* cited by examiner

*Primary Examiner*—Victor A Mandala
(74) *Attorney, Agent, or Firm*—Young & Thompson

(57) ABSTRACT

In a semiconductor device, a phase change layer is formed as a side wall and is therefore reduced in volume. Even if the number of times of rewriting is small, the phase change layer is entirely used as a phase change region. Therefore, the phase change region is not increased in volume even if the number of times of rewriting is increased. Since the volume of the phase change region is not changed, an electric current level required for rewriting is constant. Thus, the semiconductor device having a memory cell capable of carrying out stable rewriting is obtained.

17 Claims, 9 Drawing Sheets

SEMICONDUCTOR DEVICE AND METHOD OF PRODUCING THE SAME

This application claims priority to prior Japanese patent application JP 2005-212419, the disclosure of which is incorporated herein by reference.

BACKGROUND OF THE INVENTION

This invention relates to a semiconductor device and, in particular, to a semiconductor device using a phase change material as a memory element of a memory cell and a method of producing the same.

A phase change memory using a phase change material is known in the art. As the phase change material, a chalcogenide material (GeSbTe) is generally used. A change in resistance value following a change in crystal structure of the chalcogenide material is used as memory information. In the phase change memory, a chalcogenide layer obtained by depositing the chalcogenide material is used as a memory element instead of a capacitance element in a typical DRAM (Dynamic Random Access Memory). The chalcogenide layer is varied in crystal structure depending upon a heating temperature and a cooling time and exhibits a high resistance value in an amorphous state and a low resistance value in a crystalline state. In the phase change memory, the crystal structure of the chalcogenide layer is changed and the resistance value consequently changed is used as the memory information.

In order to write the information into the chalcogenide layer, two operations are carried out, i.e., a reset operation and a set operation. In the reset operation, the chalcogenide layer is supplied with sufficient Joule heat to be melted and then rapidly cooled to create an amorphous state exhibiting a high resistance. In the set operation, the chalcogenide layer is supplied with less Joule heat and gradually cooled to create a crystalline state having a face-centered cubic structure exhibiting a low resistance. A heat quantity to be supplied and a cooling rate are controlled by an electric current value and a length (application time) of a pulse applied to the chalcogenide layer. Thus, reading and writing operations as a memory are carried out by changing the crystal structure of the chalcogenide layer to thereby change the resistance value.

The phase change memory using the chalcogenide layer has a basic structure in which the chalcogenide layer is formed on an upper surface of a lower heater electrode and an upper electrode is formed on the chalcogenide layer. Thus, the lower heater electrode and the upper electrode are formed on opposite ends of the chalcogenide layer. By applying an electric voltage between these electrodes, reading and writing operations are carried out.

The phase change memory is disclosed in following patent documents.

Japanese Unexamined Patent Application Publication (JP-A) No. H04-045585 (Patent Document 1) discloses that a chalcogenide layer formed on a lower heater electrode is patterned with an upper electrode used as a mask to form a cylindrical chalcogenide layer having a small diameter.

Japanese Unexamined Patent Application Publication (JP-A) No. 2005-032855 (Patent Document 2) discloses that a lower heater electrode and a chalcogenide layer are formed in one plug for the purpose of consolidation with a standard logic process.

Japanese Unexamined Patent Application Publication (JP-A) No. 2004-349709 (Patent Document 3) discloses that oxide is formed at an interface between a lower heater electrode and a chalcogenide layer in order to increase heat generation of the lower heater electrode.

The present inventors have found a problem that, if the number of times of rewriting is increased in the memory element having each of the above-mentioned structures, reset and set resistance values are varied. When the reset and the set resistance values are varied, an electric current required for rewriting (energy required for rewriting) is increased. In other words, as the number of times of rewriting is increased, rewriting can not be carried out at a predetermined current level so that the number of times of rewriting may not be assured. On the other hand, in the abovementioned patent documents, no recognition is made about such dependency upon the number of times of rewriting and, therefore, no solution is proposed.

As described above, in the above-mentioned memory element using the chalcogenide layer, there is a problem that the resistance value of the chalcogenide layer is varied as the number of times of rewriting is increased. When the resistance value of the chalcogenide layer is varied, an electric current required for rewriting is increased. In other words, as the number of times of rewriting is increased, rewriting can not be carried out at a predetermined current level so that the number of times of rewriting may not be assured.

Concretely, the number of times of rewriting the chalcogenide layer as required in practical use is about $10^5$. However, as the number of times of rewriting is increased, the volume of a phase change region is varied and increased. In this event, rewriting requires a large electric current because the volume to be changed in phase is increased. In other words, rewriting can not be carried out at a predetermined current level. Thus, rewriting resistance or durability is not assured due to an adverse influence caused by a part of the chalcogenide layer which does not act as a phase change region in an early stage of repetition of rewriting operations.

SUMMARY OF THE INVENTION

It is an object of this invention to provide a semiconductor device having a memory cell capable of carrying out stable rewriting by the use of a chalcogenide layer reduced in volume and entirely used as a phase change region even if the number of times of rewriting is small so that, even if the number of times of rewriting is increased, the volume of the phase change region is not increased and an electric current level required for rewriting is unchanged.

It is another object of this invention to provide a method of producing a semiconductor device having a memory cell capable of carrying out stable rewriting.

According to one aspect of this invention, there is provided a semiconductor device, which includes a phase change layer as a memory element of a memory cell. The phase change layer is formed as a side wall inside a contact hole formed in an interlayer insulation film.

Preferably, the phase change layer has a bottom portion, and the phase change layer has a buried insulation film formed in the center portion of said phase changing layer. The phase change layer has a height lower than that of each of the interlayer insulation film and the buried insulation film.

Preferably, the buried insulation film is a nitride film.

Preferably, the phase changing layer has first and second electrodes connected to both end.

Preferably, the first electrode is a heater electrode for heating the phase change layer to change between the amorphous state and the crystalline state.

Preferably, the phase change layer in the contact hole has a ring shape, the second electrode being an upper electrode.

Preferably, the phase change layer is entirely used as a phase change region even in a first rewriting operation.

Preferably, the semiconductor device further includes a first insulation film formed inside the contact hole at a position between the interlayer insulation film and the phase change layer.

Preferably, the first insulation film is a nitride film.

Preferably, the phase change layer is a chalcogenide layer.

According to another aspect of this invention, there is provided a method of producing a semiconductor device.

The method includes:

an interlayer insulation film forming step of forming an interlayer insulation film on a substrate;

a contact hole forming step of depositing an interlayer insulation film and forming in the interlayer insulation film a contact hole; and a phase change layer depositing step of depositing a phase change layer along a side wall of said contact hole.

Preferably, the phase change layer depositing step is a step of forming said phase change layer to have a bottom portion.

Preferably, the method further includes:

a first electrode forming step of forming a first electrode on said substrate before the contact hole forming step; and a second electrode forming step of forming a second electrode on said phase change layer. In the method, the contact hole forming step is a step of forming the interlayer insulation film on the first electrode and forming the contact hole in the interlayer insulation film up to the first electrode.

Preferably, the method further includes a buried insulation film depositing step of depositing a buried insulation film in a center portion of the phase change layer.

Preferably, the method further includes a planarizing step of planarizing surfaces of the interlayer insulation film, the buried insulation film, and the phase change layer.

Preferably, the method further includes an etch-back step of etching back the phase change layer by which the phase change layer depositing step is followed.

Preferably, the method further includes a depositing step of depositing a first insulation film and an insulation film etch-back step of etching back the first insulation film by which the phase change layer depositing step is preceded.

Preferably, the method further includes an etching step of etching the phase change layer by which the second electrode forming step is preceded so that the phase change layer has a height lower than that of the interlayer insulation film.

Preferably, the first electrode is a heater electrode. The second electrode is an upper electrode.

Preferably, a chalcogenide material is deposited in the phase change layer depositing step, In this invention having the above-mentioned structure, the chalcogenide layer is formed as the side wall to have a minimum volume. From the first rewriting operation, the chalcogenide layer is entirely used as the phase change region so that the phase change region is not increased in volume even if the number of times of rewriting is increased. With the above-mentioned structure, an electric current level required for rewriting is reduced and rewriting is stably carried out at a constant current level.

DESCRIPTION OF THE PREFERRED EMBODIMENTS

In order to facilitate an understanding of this invention, description will at first be made of a basic structure of a chalcogenide layer in a phase change memory of a conventional semiconductor device.

Figure 1:
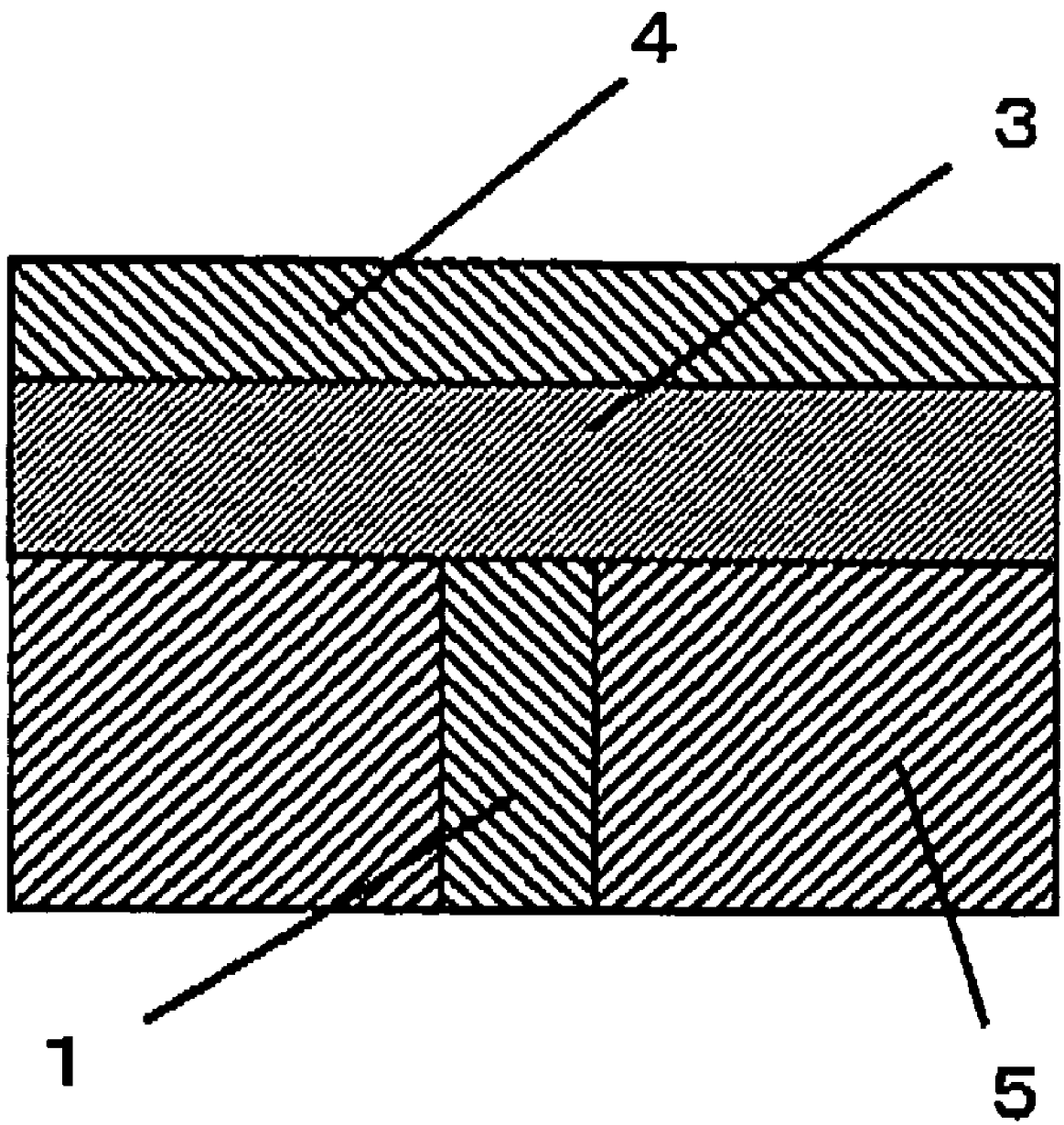
FIG. 1 is a sectional view of a memory element portion of a first conventional memory cell.

Referring to FIG. 1, a memory element portion of a first conventional memory cell has a plate-like shape and comprises a lower heater electrode 1, a chalcogenide (GeSbTe) layer 3 formed on an upper surface of the lower heater electrode 1, and an upper electrode 4 formed on the chalcogenide layer 3.

Figure 2:
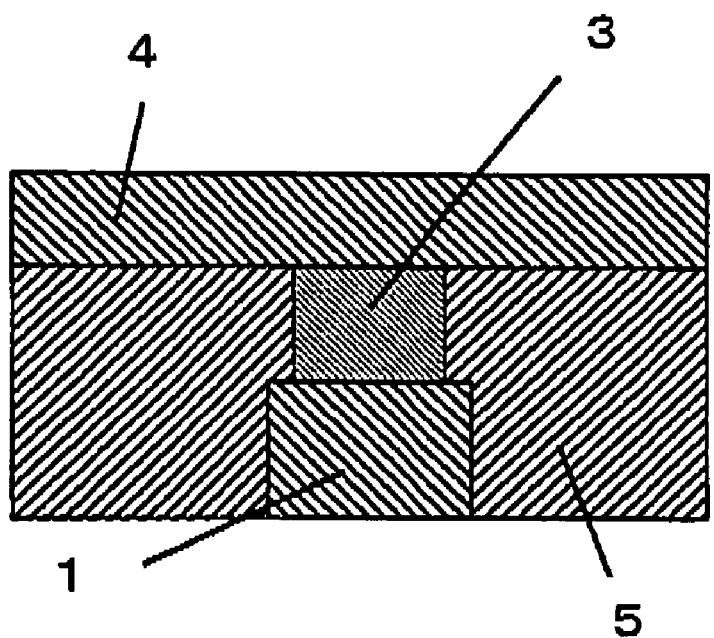
FIG. 2 is a sectional view of a memory element portion of a second conventional memory cell.

Referring to FIG. 2, a memory element portion of a second conventional memory cell comprises a lower heater electrode 1, a cylindrical chalcogenide layer 3 formed on an upper surface of the lower heater electrode 1, and an upper electrode 4 formed on the chalcogenide layer 3.

Thus, the lower heater electrode 1 and the upper electrode 4 are formed at opposite ends of the chalcogenide layer 3. By applying an electric voltage between the lower heater electrode 1 and the upper electrode 4, writing and reading operations are carried out.

Figure 5:
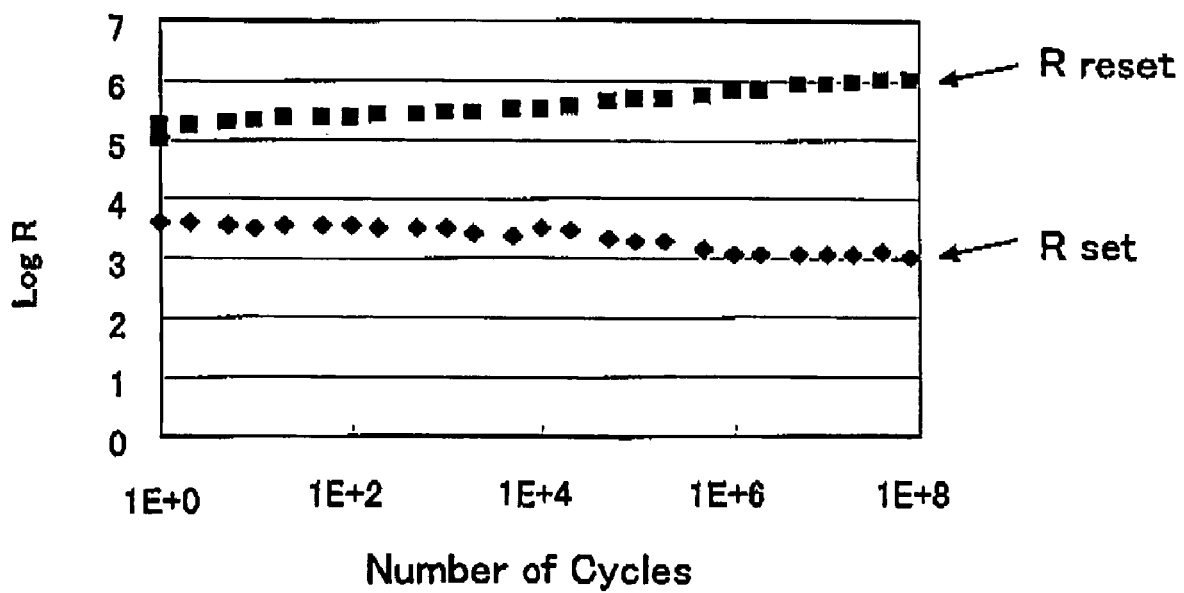
FIG. 5 is a view showing correlation between resistance values of chalcogenide and the number of times of rewriting.

Referring to FIG. 5, as the number of times of rewriting is increased, a resistance value R of the chalcogenide layer 3 is varied, For example, a reset resistance value (Rreset) is increased to about 10 times an initial value when the number of times of rewriting is $10^2$. A set resistance value (Rset) is decreased to about $\frac{1}{5}$ to $\frac{1}{10}$ when the number of times of rewriting is $10^2$.

Figure 3:
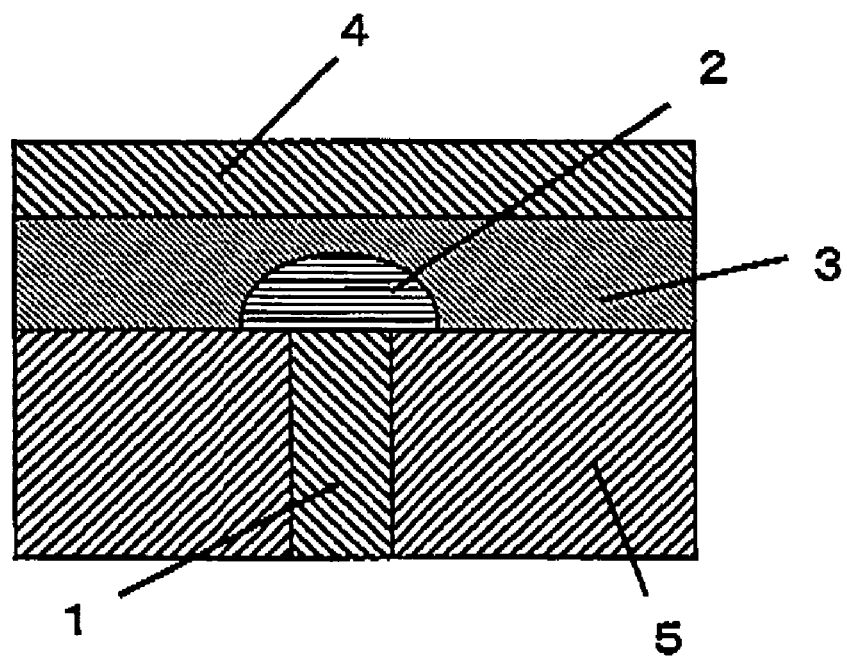
FIG. 3 is a schematic sectional view showing a phase change region of the memory element portion of the memory cell in case where the number of times of rewriting is small, in order to describe the problem in the conventional technique.
Figure 4:
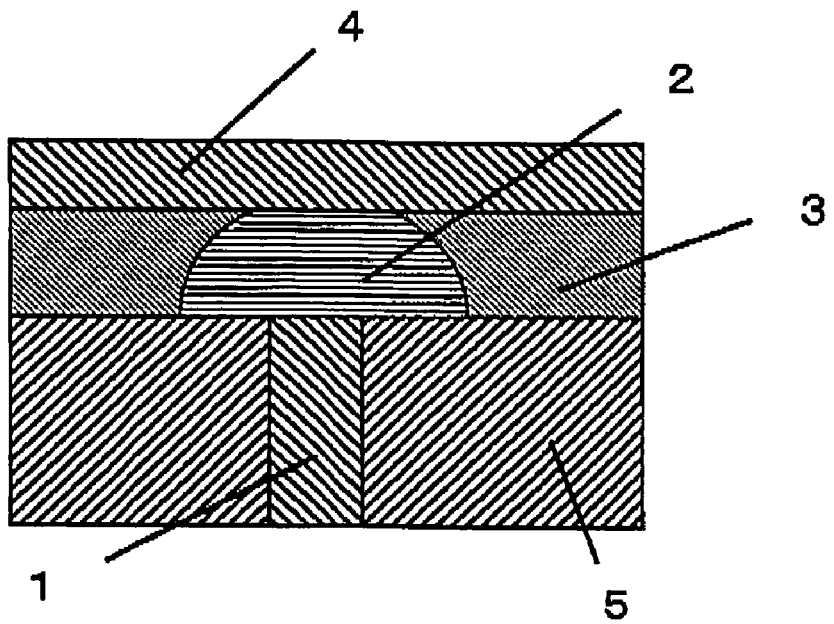
FIG. 4 is a schematic sectional view showing the phase change region of the memory element portion of the memory cell in case where the number of times of rewriting is large, in order to describe the problem in the conventional technique.

Consideration will be made about the reason for such variation in resistance value. FIGS. 3 and 4 show a phase change region 2 at an initial stage and at a later stage when the number of times of rewriting is increased, respectively.

It is noted here that the phase change region 2 is a region of the chalcogenide layer 3 which is changed in crystal structure. A rewriting voltage is applied between the lower heater electrode 1 and the upper electrode 4 to flow a rewriting current at a part of the chalcogenide layer 3. The rewriting current causes the chalcogenide layer 3 to generate heat. As a consequence, the crystal structure is changed and an electric resistance is changed. The region of the chalcogenide layer 3 which is changed in crystal structure is defined as the phase change region 2.

Referring to FIG. 3, the phase change region 2 of the chalcogenide layer 3 in an initial state when the number of times of rewriting is small is a small region and has a small volume. However, when the number of times of rewriting is increased, the phase change region 2 is increased in size (volume) as shown in FIG. 4 due to an electric current flowing upon every rewriting. Thus, the volume of the phase change region 2 is changed so that the resistance values are changed as illustrated in FIG. 5. As a result, a large current is required for rewriting.

Now, this invention will be described in conjunction with several preferred embodiments thereof with reference to the drawing.

First Embodiment

Referring to FIGS. 6 to 13, description will be made of a memory element portion of a memory cell according to a first embodiment of this invention. In the figures, those parts directly related to this invention, including a chalcogenide layer, a heater electrode, and an upper electrode, are illustrated and other parts such as transistors and wiring layers contained in a typical semiconductor device are omitted.

Figure 6:
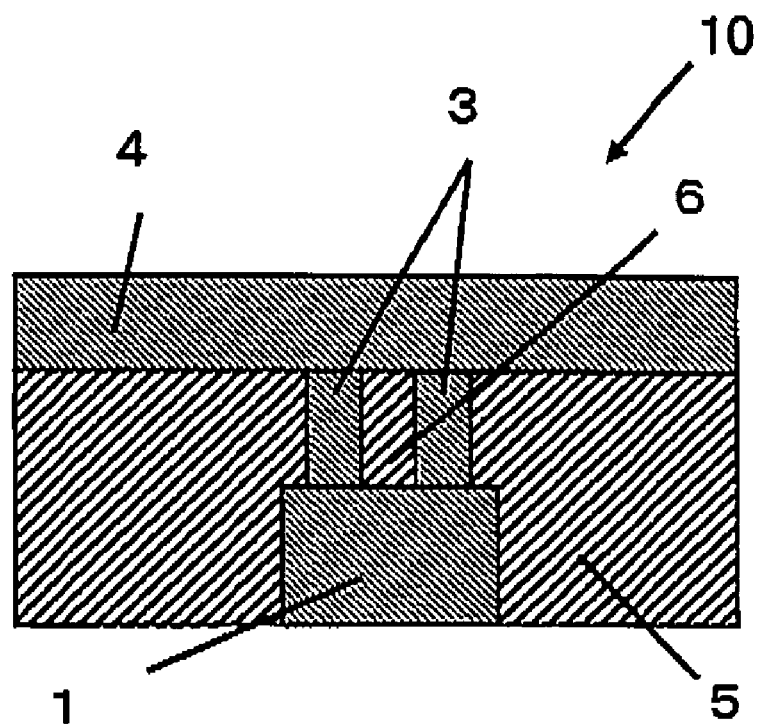
FIG. 6 is a sectional view of a memory element portion of a memory cell according to a first embodiment of this invention.

As illustrated in FIG. 6, a chalcogenide layer 3 according to the first embodiment is formed into a ring shape as a side wall along an inner surface of a contact hole 7 formed on a heater electrode or first electrode 1 as phase changing portion and penetrating an interlayer insulation film 5 of a thermal oxide film ($SiO_2$). A buried insulation film 6 is filled inside the chalcogenide layer 3 of a ring shape. Surfaces of the interlayer insulation film 5, the buried insulation film 6, and the chalcogenide layer 3 are planarized or flattened by CMP (Chemical Mechanical Polishing). Then, a second electrode or an upper electrode 4 is formed. As the heater electrode 1, use may be made of TiAlN, TiSiN, TaAlN, TaSiN, or the like. As the interlayer insulation film 5, SiN, SiOC, $CF_2$, or the like may be used instead of $SiO_2$.

Figure 7:
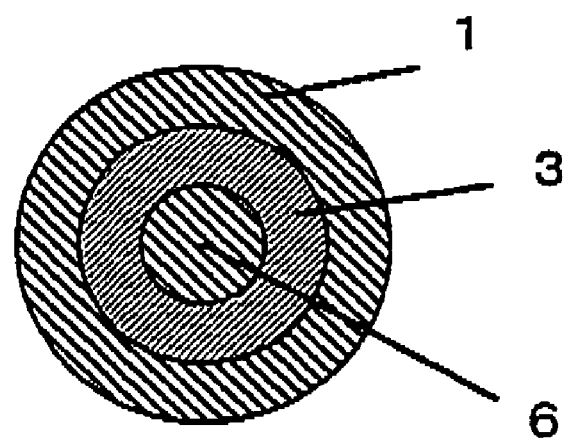
FIG. 7 is a top view of the memory element portion of the memory cell illustrated in FIG. 6.

Referring to FIG. 7, the chalcogenide layer 3 of a ring shape is formed on the heater electrode 1 around the buried insulation film 6.

Figure 8:
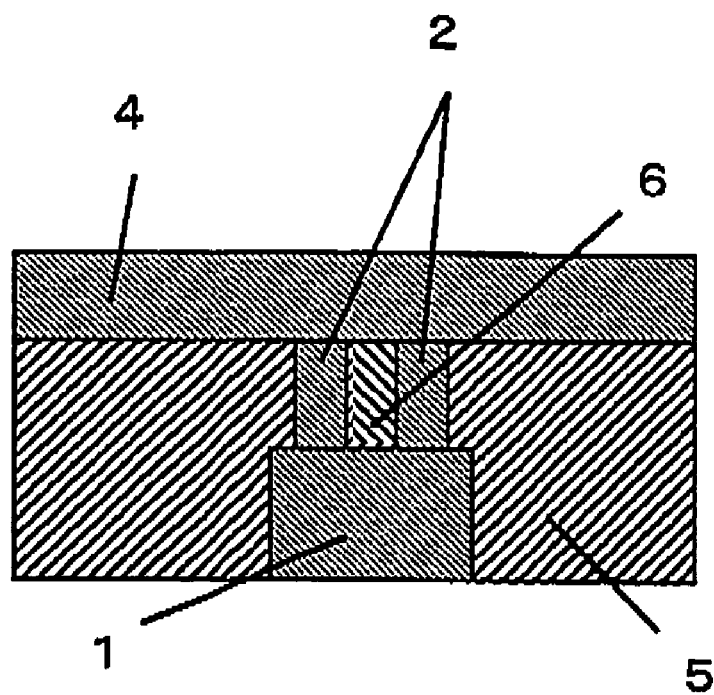
FIG. 8 is a sectional view showing a phase change region of the memory element portion of the memory cell illustrated in FIG. 6.

The chalcogenide layer 3 has a volume determined by a thickness of the chalcogenide layer 3 and a diameter and a depth of the contact hole 7 penetrating the interlayer insulation film 5. By forming the chalcogenide layer 3 as a side wall, the volume of the chalcogenide layer 3 is reduced. By reducing the volume of the chalcogenide layer 3, the chalcogenide layer 3 is entirely used as a phase change region 2 as illustrated in FIG. 8 even upon rewriting in an initial stage. Therefore, even if the number of times of rewriting is increased, the volume of the phase change region 2 is not increased and a rewriting operation is stably carried out by a predetermined rewriting current.

By forming the chalcogenide layer 3 as a side wall, the volume of the chalcogenide layer 3 depends upon the thickness of the chalcogenide layer 3 and the diameter and the depth of the contact hole 7. The volume of the chalcogenide layer 3 is selected and determined within a range such that a variation in resistance value of the memory element portion of the memory cell can be detected as memory information of the memory cell. Further, by reducing the volume of the chalcogenide layer 3, the rewriting current is reduced. Therefore, a semiconductor device reduced in current consumption is obtained.

Next referring to FIGS. 9 to 13, a method of producing the semiconductor device according to the first embodiment will be described.

Figure 9:
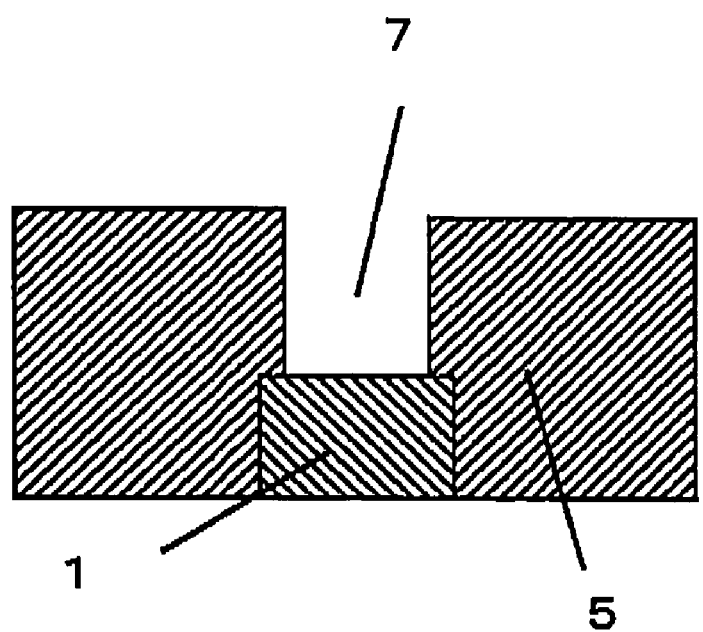
FIG. 9 is a sectional view of the memory element portion of the memory cell in a step (1) according to the first embodiment.
Figure 10:
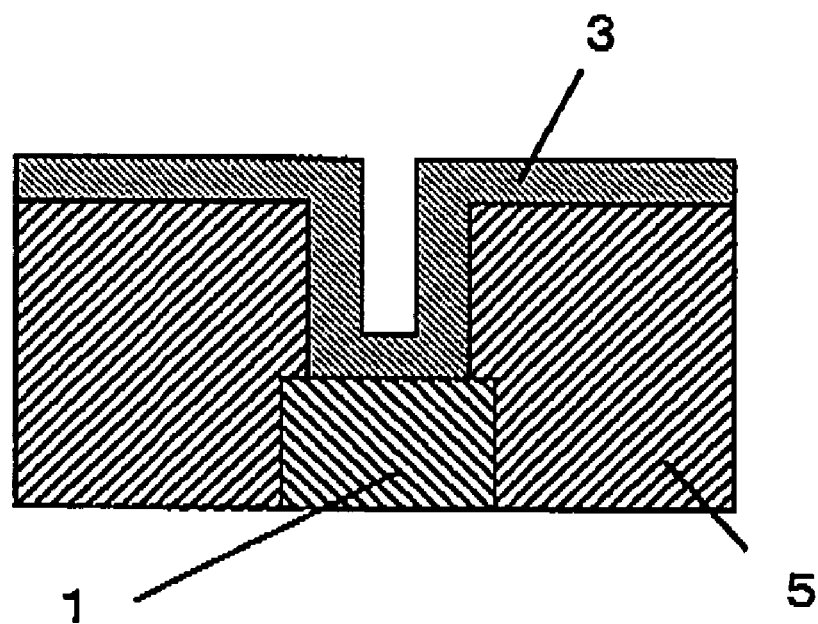
FIG. 10 is a sectional view of the memory element portion of the memory cell in a step (2) according to the first embodiment.

Referring to FIG. 9, on a semiconductor substrate (not shown) with the heater electrode 1 formed thereon, the interlayer insulation film 5 is deposited. The contact hole 7 to serve as a contact is formed in the interlayer insulation film 5 to reach the heater electrode 1. The volume of the phase change region 2 depends upon the depth and the diameter of the contact hole 7. Thereafter, the chalcogenide layer 3 is deposited on a surface of the interlayer insulation film 5 (FIG. 10). The chalcogenide layer 3 is preferably deposited by a method excellent in coverage, for example, MOCVD (metal organic chemical vapor deposition) but may be formed by sputtering.

The volume of the phase change region 2 is determined by the depth and the diameter of the contact hole 7 and the thickness of the chalcogenide layer 3. These dimensions are independent from one another so that the volume of the chalcogenide layer 3 is freely selected. If the diameter of the contact hole 7 is reduced, the volume of the chalcogenide layer 3 is reduced. On the contrary, if the diameter of the contact hole 7 is increased to be greater than a minimum dimension of lithography and the thickness of the chalcogenide layer 3 is reduced, the volume of the chalcogenide layer 3 is reduced. Thus, without being limited by the minimum lithography dimension, the chalcogenide layer 3 having a small volume and stable in mass-production is formed. Thus, the volume of the chalcogenide layer 3 is reduced and the chalcogenide layer 3 is entirely used as the phase change region 2 so that an electric current level required for rewriting is reduced.

Next, the chalcogenide layer 3 deposited is etched back by dry etching (FIG. 11) to form a ring-shaped side wall on an inner surface of the contact hole 7 penetrating the interlayer insulation film 5. Then, the buried insulation film 6 is deposited to be filled inside the chalcogenide layer 3 of a ring shape (FIG. 12). Preferably, the buried insulation film 6 is an insulation film excellent in coverage. However, the buried insulation film 6 is not necessarily completely filled provided that, even if voids are produced inside, these voids do not appear on a surface of the buried insulation film 6 at the time of planarizing CMP to be carried out later. The buried insulation film 6 may be an oxide film or a nitride film. The nitride film is preferable.

Figure 13:
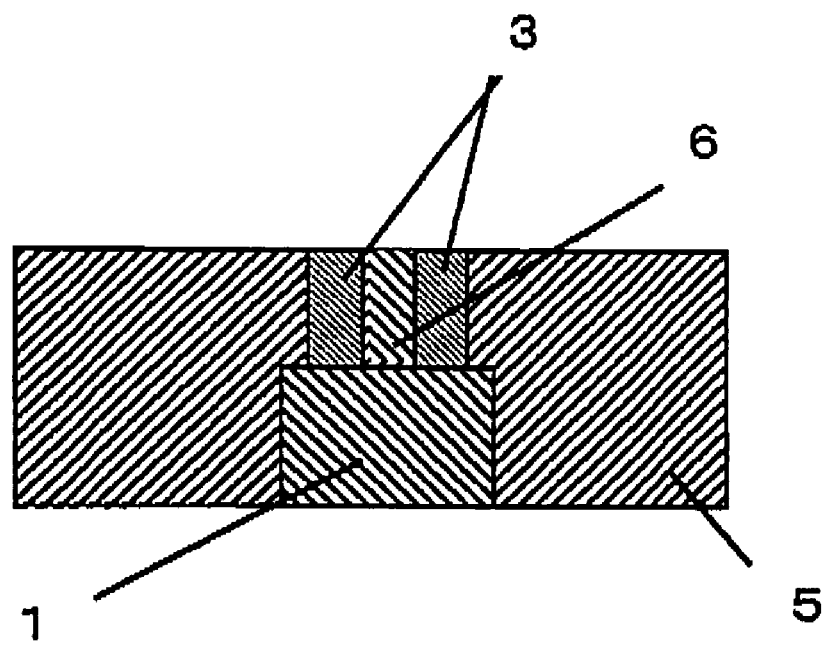
FIG. 13 is a sectional view of the memory element portion of the memory cell in a step (5) according to the first embodiment.

Next referring to FIG. 13, CMP (chemical mechanical polishing) is performed to planarize the surface. By the CMP, the insulation films of the buried insulation film 6 and the interlayer insulation film 5 as well as upper rounded parts of the chalcogenide layer 3 are polished to be planarized. By a polishing amount by the CMP, a final depth of the contact hole 7 is determined. Therefore, the volume of the chalcogenide layer 3 is also determined by the polishing amount by the CMP. Thereafter, the upper electrode 4 is formed to complete the memory element portion (FIG. 6).

In the memory element portion of the memory cell according to this embodiment, the chalcogenide layer is formed as a side wall so that the volume of the chalcogenide layer is reduced. The volume of the chalcogenide layer is determined by the thickness of the chalcogenide layer and the diameter and the depth of the contact hole. Thus, by forming the chalcogenide layer as a side wall, the volume of the chalcogenide layer can be smaller than that in case where the chalcogenide layer is formed by the use of a minimum dimension of lithography. As the volume of the chalcogenide layer is small, the chalcogenide layer is entirely used as a phase change region even if the number of times of rewriting is small. Therefore, the phase change region is prevented from being increased in volume due to the increase in number of times of rewriting. Accordingly, a rewriting error due to variation in phase change region is not caused to occur. Further, because the volume of the chalcogenide layer is small, the memory cell can be rewritten by a small rewriting current. Thus, it is possible to obtain the memory cell having a stable rewriting characteristic with a small rewriting current and the semiconductor device having the memory cell.

Second Embodiment

Figure 14:
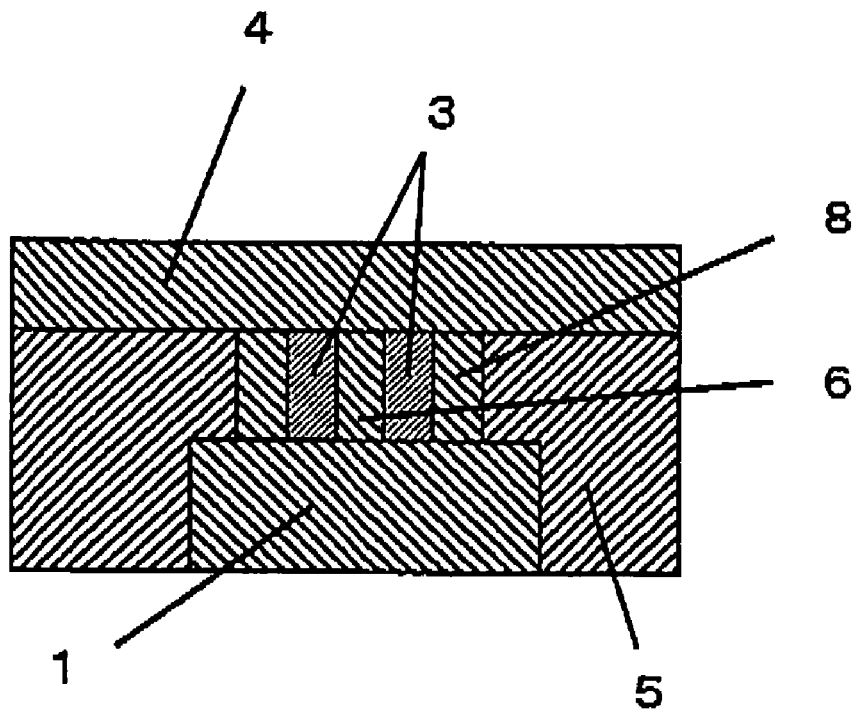
FIG. 14 is a sectional view of a memory element portion of a memory cell according to a second embodiment of this invention.

Referring to FIG. 14, a second embodiment of this invention will be described.

As illustrated in FIG. 14, the second embodiment is different from the first embodiment in that a first insulation film 8 is formed as a side wall inside the contact hole 7 at a position between the interlayer insulation film 5 and the chalcogenide layer 3. Similar parts are designated by like reference numerals and description thereof is omitted.

A memory cell illustrated in FIG. 14 comprises the first insulation film 8 as the side wall inside the contact hole 7 formed in the interlayer insulation film 5. Inside the first insulation film 8, the chalcogenide layer 3 and the buried insulation film 6 are formed. In the structure of the second embodiment, the chalcogenide layer 3 has upper and lower surfaces contacted with the first electrode or heater electrode 1 as phase changing portion and the upper electrode 4 and a side surface contacted with the first insulation film 8 and the buried insulation film 6. In the structure of this embodiment, materials of the first insulation film 8 and the buried insulation film 6 are freely selected. Herein, as the first insulation film 8 and the buried insulation film 6, a material hardly reacted with the chalcogenide layer 3 may be selected. Since the chalcogenide layer 3 is possibly reacted with oxygen, the first insulation film 8 and the buried insulation film 6 are preferably made of a nitride (SiN) film.

Description will be made of a method of producing a semiconductor device according to the second embodiment will be described with reference to FIGS. 9 to 13 in the first embodiment. The contact hole 7 is formed in the interlayer insulation film 5 illustrated in FIG. 9. A nitride (SiN) film is deposited as the first insulation film 8. The first insulation film 8 deposited is etched back to leave the first insulation film 8 only on an inner surface of the contact hole 7 as a side wall of a ring shape. Thereafter, according to the steps illustrated in FIGS. 10 to 13, deposition of the chalcogenide layer 3, etching back of the chalcogenide layer 3, deposition of a nitride (SiN) film as the buried insulation film 6, and planarizing CMP are carried out. Finally, the upper electrode 4 is formed. In this embodiment, the step of depositing the first insulation film 8 and the step of etching back the first insulation film 8 are added after formation of the contact hole 7 (FIG. 9) in the production process of the first embodiment. As each of the first insulation film 8 and the buried insulation film 6, a nitride (SiN) film is used.

In the memory cell in this embodiment, the first insulation film and the chalcogenide layer are formed as side walls so that the volume of the chalcogenide layer is further reduced. The volume of the chalcogenide layer is determined by the thickness of the chalcogenide layer and the diameter and the depth of the contact hole. Thus, by forming the first insulation film and the chalcogenide layer as side walls, the volume of the chalcogenide layer can be smaller than that in case where the chalcogenide layer is formed by the use of a minimum dimension of lithography. As the volume of the chalcogenide layer is small, the chalcogenide layer is entirely used as a phase change region even if the number of times of rewriting is small. Therefore, the phase change region is prevented from being increased in volume due to the increase in number of times of rewriting. Accordingly, a rewriting error due to variation in phase change region is not caused to occur. Further, because the volume of the chalcogenide layer is small, the memory cell can be rewritten by a small rewriting current. Further, the first insulation film and the buried insulation film hardly reacted with the chalcogenide layer are formed at interfaces with the chalcogenide layer. Therefore, the chalcogenide layer becomes more stable. Thus, it is possible to obtain the memory cell having a stable rewriting characteristic with a small rewriting current and the semiconductor device having the memory cell.

Third Embodiment

Figure 15:
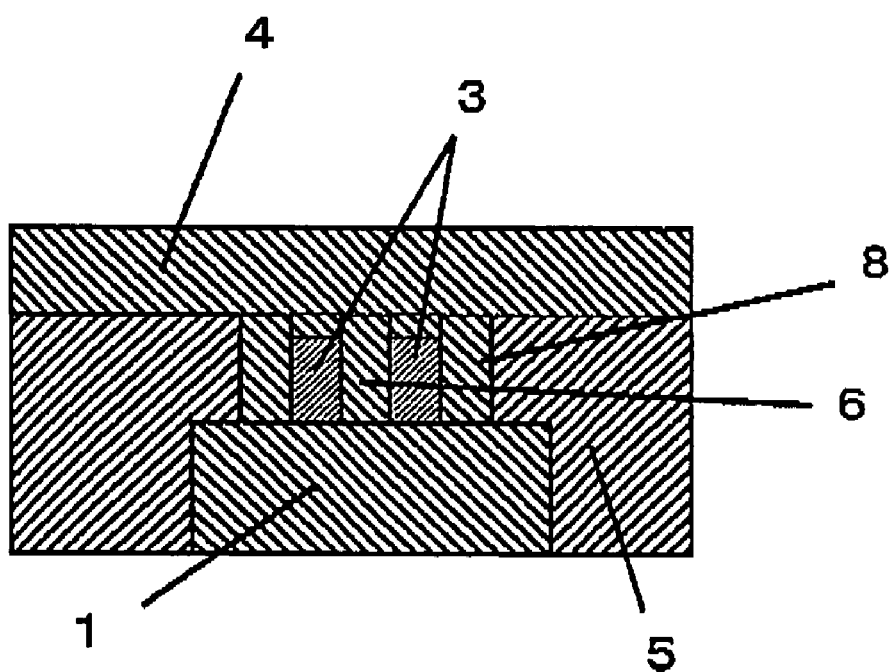
FIG. 15 is a sectional view of a memory element portion of a memory cell according to a third embodiment of this invention.

Referring to FIG. 15, a third embodiment of this invention will be described. FIG. 15 is a sectional view of a memory element portion of a memory cell according to the third embodiment. This embodiment is different from the second embodiment in that the chalcogenide layer has a recessed structure and is further reduced in volume. As illustrated in FIG. 15, the chalcogenide layer 3 has a recessed structure lower in height than planarized surfaces of the interlayer insulation film 5, the first insulation film 8, and the buried insulation film 6. The upper electrode 4 is formed on the planarized surfaces and in a recessed portion. The chalcogenide layer 3 has side surfaces contacted with the first insulation film 8 and the buried insulation film 6 like in the second embodiment. Similar parts are designated by like reference numerals and description thereof is omitted.

Description will be made of a method of producing a semiconductor device according to the third embodiment will be described with reference to FIGS. 9 to 13 in the first embodiment. The contact hole 7 is formed in the interlayer insulation film 5 illustrated in FIG. 9. A nitride (SiN) film is deposited as the first insulation film 8. The first insulation film 8 deposited is etched back to leave the first insulation film 8 only on an inner surface of the contact hole 7 as a side wall of a ring shape. Thereafter, according to the steps illustrated in FIGS. 10 to 13, deposition of the chalcogenide layer 3, etching back of the chalcogenide layer 3, deposition of a nitride (SiN) film as the buried insulation film 6, and planarizing CMP are carried out. Further, a part of the chalcogenide layer 3 is etched to depress the chalcogenide layer 3 from the surfaces of the interlayer insulation film 5, the first insulation film 8, and the buried insulation film 6 planarized by CMP. As a result, the height of the chalcogenide layer 3 is lowered. After the height of the chalcogenide layer 3 is lowered to form a recessed structure, the upper electrode 4 is formed. In this embodiment, the second embodiment is modified so that the chalcogenide layer 3 has a recessed structure. However, this embodiment is also applicable to the structure of the first embodiment.

In the memory cell of this embodiment, the chalcogenide layer is formed as a side wall and is depressed from the planarized surfaces to have a recessed structure. Thus, the volume of the chalcogenide layer is further reduced. By forming the chalcogenide layer into a recessed structure, the volume of the chalcogenide layer is further reduced by an amount corresponding to the recessed portion as compared with the second embodiment. Thus, by forming the chalcogenide layer as a side wall and further into a recessed structure, the volume of the chalcogenide layer can be smaller than that in case where the chalcogenide layer is formed by the use of a minimum dimension of lithography. As the volume of the chalcogenide layer is small, the chalcogenide layer is entirely used as a phase change region even if the number of times of rewriting is small. Therefore, the phase change region is prevented from being increased in volume due to the increase in number of times of rewriting. Accordingly, a rewriting error due to variation in phase change region is not caused to occur. Further, because the volume of the chalcogenide layer is small, the memory cell can be rewritten by a small rewriting current. Further, the first insulation film and the buried insulation film hardly reacted with the chalcogenide layer are formed at interfaces with the chalcogenide layer. Therefore, the chalcogenide layer becomes more stable. Thus, it is possible to obtain the memory cell having a stable rewriting characteristic with a small rewriting current and the semiconductor device having the memory cell.

Fourth Embodiment

Figure 16:
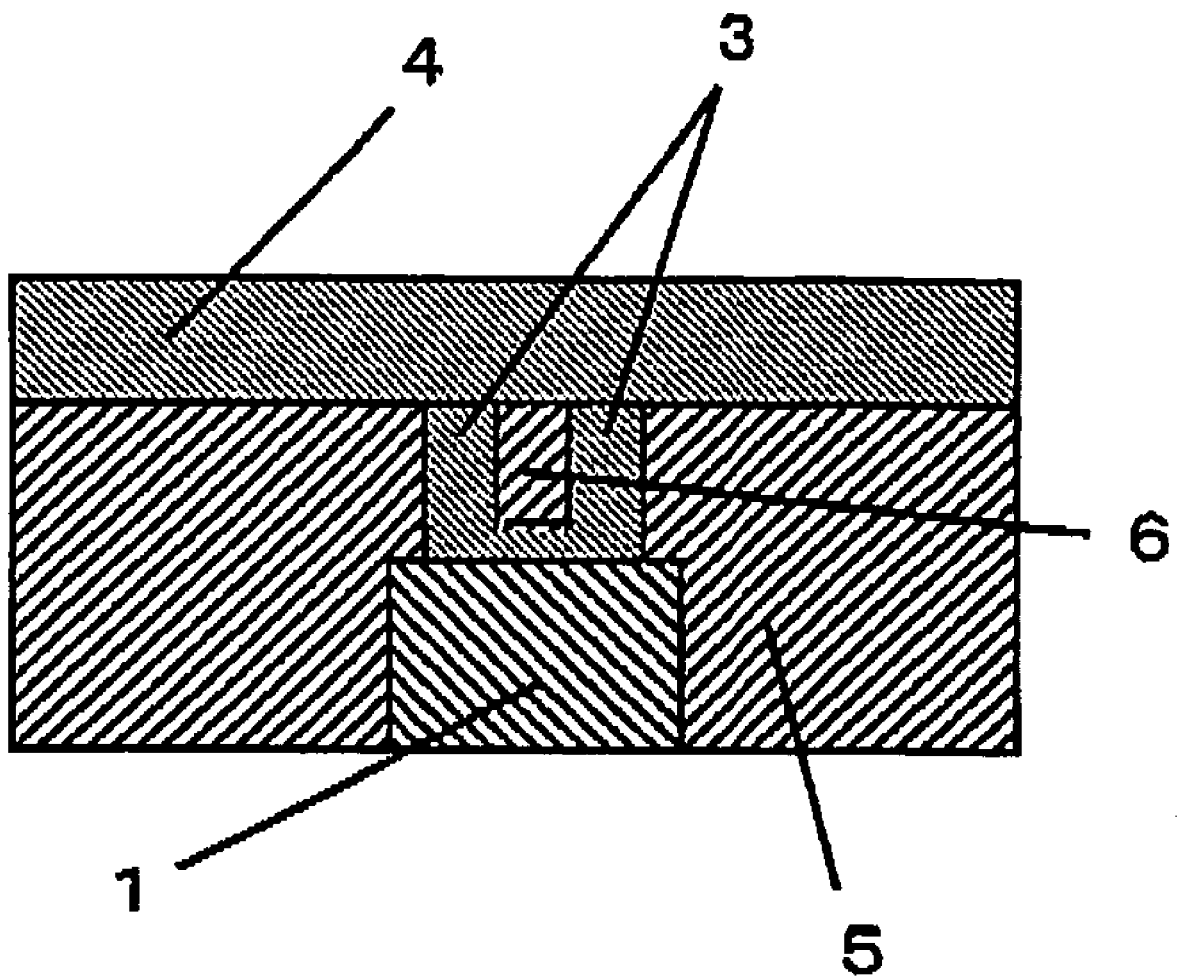
FIG. 16 is a sectional view of a memory element portion of a memory cell according to a fourth embodiment of this invention.

Referring to FIG. 16, a fourth embodiment of this invention will be described. FIG. 16 is a sectional view of a memory element portion of a memory cell according to this embodiment. In this embodiment, the production process in the first embodiment is shortened by omitting the step of etching back the chalcogenide layer. The chalcogenide layer in this embodiment is formed as the side wall and is also formed at a bottom of the contact hole. Similar parts are designated by like reference numerals and description thereof is omitted.

A method of producing a semiconductor device according to the fourth embodiment will be described with reference to FIGS. 9 to 13 in the first embodiment.

The contact hole 7 is formed in the interlayer insulation film 5 illustrated in FIG. 9. As illustrated in FIG. 10, the chalcogenide layer 3 is deposited. Thereafter, without etching back the chalcogenide layer 3, the buried insulation film 6 is deposited. In the planarizing CMP, the chalcogenide layer 3 on an upper surface of the interlayer insulation film 5 is simultaneously polished. Thereafter, the upper electrode 4 is formed.

Figure 11:
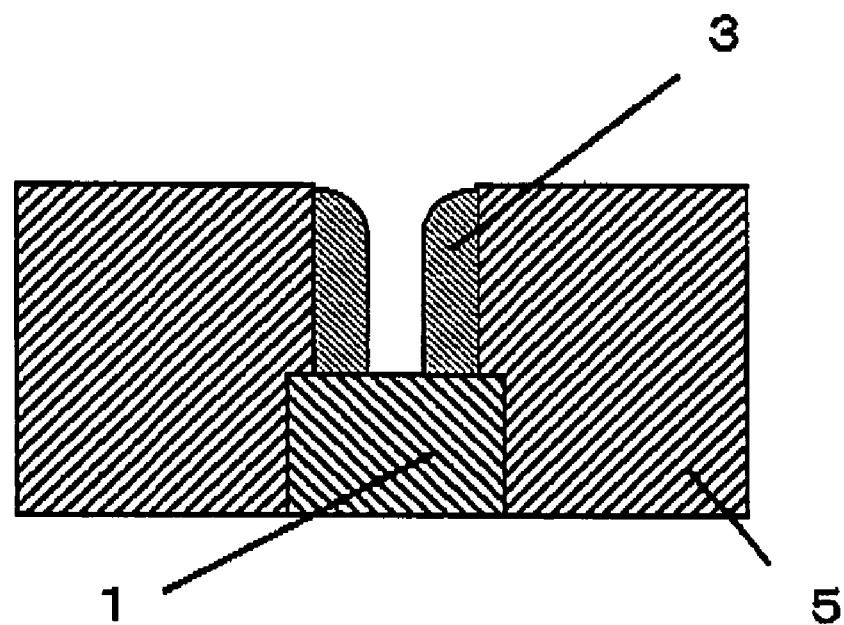
FIG. 11 is a sectional view of the memory element portion of the memory cell in a step (3) according to the first embodiment.
Figure 12:
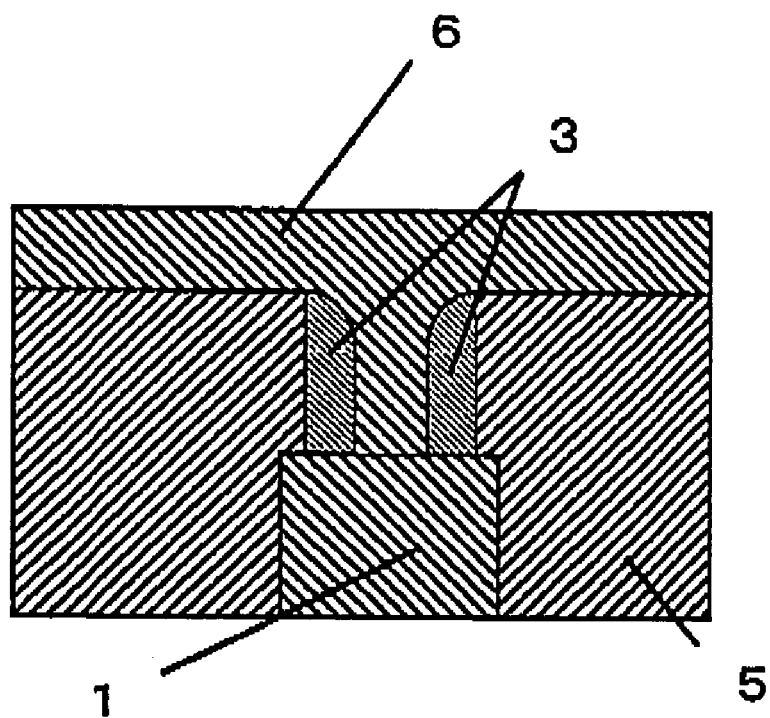
FIG. 12 is a sectional view of the memory element portion of the memory cell in a step (4) according to the first embodiment.

In the fourth embodiment, etching back of the chalcogenide layer 3 in FIG. 11 is omitted to shorten the production process. Therefore, as compared With the first embodiment, the chalcogenide layer at the bottom of the contact hole is added. However, by forming the chalcogenide layer as a side wall, the volume of the chalcogenide layer is reduced, The volume of the chalcogenide layer is determined by the thickness of the chalcogenide layer and the diameter and the depth of the contact hole. Thus, by forming the chalcogenide layer as a side wall, the volume of the chalcogenide layer can be smaller than that in case where the chalcogenide layer is formed by the use of a minimum dimension of lithography. The chalcogenide layer at the bottom is directly contacted with the heater electrode 1. Therefore, the chalcogenide layer is entirely used as the phase change region irrespective of the number of times of rewriting. Thus, in this embodiment also, the phase change region is not increased in volume even if the number of times of rewriting is increased. Thus, even in case where the production process is shortened without etching back the chalcogenide layer 3, a stable rewriting operation is achieved.

The chalcogenide layer of the memory cell in this embodiment is formed at the bottom of the contact hole and as the side wall of the inner surface of the contact hole. By forming the chalcogenide layer as a side wall, the volume of the chalcogenide layer can be smaller than that in case where the chalcogenide layer is formed by the use of a minimum dimension of lithography. By reducing the volume of the chalcogenide layer, the chalcogenide layer is entirely used as the phase change region from the beginning irrespective of the number of times of rewriting. Thus, the phase change region is not increased in volume even if the number of times of rewriting is increased. Thus, it is possible to obtain the memory cell having a stable rewriting characteristic with a small rewriting current and the semiconductor device having the memory cell.

Although this invention has been described in conjunction with the preferred embodiments thereof, this invention is not limited to the foregoing embodiments but may be modified in various other manners. For example, the chalcogenide layer is used as the phase change layer in the foregoing description, However, without being limited thereto, any other appropriate material variable in resistance value following the change in phase may be used as the phase change layer. Further, the chalcogenide layer at the bottom of the contact hole may be formed in the third embodiment, like in the fourth embodiment. Thus, the foregoing embodiments may be combined as desired. It will readily be understood that various modifications may be made within the scope of this invention and these modifications are covered by this invention.

What is claimed is:

1. A semiconductor device comprising:
a phase change layer as a memory element of a memory cell, said phase change layer is formed as a side wall inside a contact hole formed in an interlayer insulation film; and
a buried insulation film formed in a center portion of said phase change layer,
wherein said phase change layer and said buried insulation film each have first and second electrodes directly connected to both ends thereof, and
wherein said first electrode is a heater electrode for heating said phase change layer to change between the amorphous state and the crystalline state.

2. The semiconductor device according to claim 1, wherein the buried insulation film is a nitride film.

3. The semiconductor device according to claim 1, wherein the phase change layer in the contact hole has a ring shape, the second electrode being an upper electrode.

4. The semiconductor device according to claim 1, wherein the phase change layer is entirely used as a phase change region even in a first rewriting operation.

5. The semiconductor device according to claim 1, wherein the semiconductor device further comprises a first insulation film formed inside the contact hole at a position between the interlayer insulation film and the phase change layer.

6. The semiconductor device according to claim 5, wherein the first insulation film is a nitride film.

7. The semiconductor device according to claim 1, wherein the phase change layer is a chalcogenide layer.

8. A semiconductor device comprising:
a phase change layer as a memory element of a memory cell, said phase change layer being formed as a side wall inside a first contact hole that is formed in a first interlayer insulation film; and
a buried insulation film formed in the first contact hole, said buried insulation film being surrounded by said phase change layer,
wherein said phase change layer and said buried insulation film each have bottom surfaces at a same level, a first electrode being directly connected to the bottom surfaces of both said phase change layer and said buried insulation film, and
said phase change layer and said buried insulation film each have top surfaces at a same level, a second electrode being directly connected to the top surfaces of both said phase change layer and said buried insulation film,
wherein said first electrode is a heater electrode for heating said phase change layer to change between an amorphous state and a crystalline state.

9. The semiconductor device according to claim 8, wherein the first electrode is formed in a second contact hole formed in a second insulation film which is disposed under the first interlayer insulation film.

10. The semiconductor device according to claim 9, wherein a diameter of the second contact hole is larger than a diameter of the first contact hole.

11. The semiconductor device according to claim 8, wherein the buried insulation film is a silicon nitride film.

12. The semiconductor device according to claim 8, wherein the phase change layer in the first contact hole has a ring shape in plan view.

13. The semiconductor device according to claim 8, wherein the phase change layer is a chalcogenide layer.

14. A semiconductor device comprising:
a phase change layer as a memory element of a memory cell, said phase change layer being formed as a side wall inside a first contact hole that is formed in a first interlayer insulation film;
a buried insulation film formed in a center portion of said phase change layer;
a first electrode directly connected to bottom surfaces of both said phase change layer and said buried insulation film; and
a second electrode directly connected to top surfaces of both said phase change layer and said buried insulation film,
wherein said first electrode is a heater electrode for heating said phase change layer to change between an amorphous state and a crystalline state.

15. The semiconductor device according to claim 14, wherein the bottom surface of the phase change layer and the bottom surface of the buried insulation film are formed at a same level.

16. The semiconductor device according to claim 14, wherein the top surface of the phase change layer and the bottom surface of the buried insulation film are formed at a same level.

17. The semiconductor device according to claim 14, wherein the first electrode is formed as a plug shape being filled in a second contact hole formed in a second insulation film which is disposed under the first interlayer insulation film.

* * * * *